United States Patent

Wojtasinski et al.

[11] 4,100,487
[45] Jul. 11, 1978

[54] LIGHTNING CURRENT WAVEFORM MEASURING SYSTEM

[76] Inventors: James C. Fletcher, Administrator of the National Aeronautics and Space Administration, with respect to an invention of; Ronald J. Wojtasinski, Cocoa Beach; Jerry C. Fuchs, Cocoa, both of Fla.; Charles H. Grove, Huntsville, Ala.

[21] Appl. No.: 782,693

[22] Filed: Mar. 30, 1977

[51] Int. Cl.² ............................................. G01R 31/00
[52] U.S. Cl. ........................................ 324/96; 324/72; 324/133
[58] Field of Search ................... 324/96, 72, 72.5, 133, 324/102

[56] References Cited

U.S. PATENT DOCUMENTS

| | | | |
|---|---|---|---|
| 3,346,811 | 10/1967 | Perry et al. | 324/96 |
| 3,590,374 | 6/1971 | Evans et al. | 324/96 |
| 3,662,263 | 5/1972 | Bensel | 324/96 |
| 3,943,367 | 3/1976 | Baker | 324/72.5 X |
| 3,952,247 | 4/1976 | Horichi | 324/96 X |
| 4,032,843 | 6/1977 | Loucks | 324/96 |

FOREIGN PATENT DOCUMENTS

| | | | |
|---|---|---|---|
| 868,007 | 4/1971 | Canada | 324/96 |
| 936,216 | 9/1963 | United Kingdom | 324/72 |

OTHER PUBLICATIONS

Chambers et al., Digital Peak Detecting & Ripple Testing Device, I.B.M. Technical Disclosure Bulletin, Dec. 1974, pp. 1869 & 1870.

Primary Examiner—Stanley T. Krawczewicz
Attorney, Agent, or Firm—James O. Harrell; John R. Manning

[57] ABSTRACT

An apparatus for monitoring current waveforms produced by lightning strikes which generate currents in an elongated cable. These currents are converted to voltages and to light waves for being transmitted over an optical cable to a remote location. At the remote location the waves are reconstructed back into electrical waves for being stored into a memory. The information is stored within the memory with a timing signal so that only different signals need be stored in order to reconstruct the wave form.

6 Claims, 4 Drawing Figures

LIGHTNING CURRENT WAVEFORM MEASURING SYSTEM

ORIGIN OF THE INVENTION

The invention described herein was made in performance of work under a NASA contract and is subject to the provision of Section 305 of the National Aeronautics Space Act of 1968, Public Law 85-568 (72 Stat. 435, 402 U.S. C.P. 2457).

BACKGROUND OF THE INVENTION

The present invention relates to an apparatus for monitoring high voltages in cables and more particularly to an apparatus for monitoring the current flow through a cable produced by lightning strikes.

In the past there have been various instruments for monitoring and measuring the waveform produced by lightning, however, these devices have encountered problems in that frequently they were adversely affected by transient voltages and spurious signals. Such would, in turn, produce false data and possibly damage or interfere with the monitoring operation and equipment.

Another problem with devices heretofore known is that they were limited as to the amount of data that could be stored therein. Such was due to the fact that normally when the device was turned on, all of the equipment such as storage equipment, printers and tape recorders operated continuously during the monitoring operation. This required large storage equipment and facilities, as well as a large amount of electronic memory, paper and recording medium for the small amount of actual information stored.

SUMMARY OF THE INVENTION

The invention includes an apparatus for monitoring current waveforms produced by lightning strikes. An elongated cable is attached to a mass carried on top of a platform such as a launch platform in the vicinity where it is desired to monitor the lightning strikes. A coil means encircles the elongated member and generates a voltage responsive to the current flowing through the elongated member. A light emitting means is connected to the coil means for generating a light wave corresponding to the voltage produced in the coil means. An optical receiver is remotely located from the area in which the lightning strikes are being monitored. Extending between the optical receiver and the light emitting means is an optical cable through which the light waves are transmitted. An analog-to-digital converter is connected to the optical receiver for converting the signals appearing on the output of the optical receiver into digital signals. A data register is connected to the output of the analog-to-digital converter for storing the last information received from the analog-to-digital converter. A comparator means is provided for comparing the information previously stored in the data register with the information coming from the analog-to-digital converter for causing the information being received to be loaded into a memory wherein the comparison indicates a predetermined difference. A timing circuit including a clock, is provided for synchronizing the operation of the various components and for indicating the exact time that information is stored within the memory.

Accordingly, it is an important object of the invention to provide a lightning current waveform measuring system which produces a waveform corresponding to the voltage wave produced by the lightning at a remote location.

Another important object of the present invention is to provide a lightning current waveform measuring system which utilizes a minimum amount of storage equipment for storing the information or waveforms produced by lightning strikes by merely turning on the recording equipment when the information is being received.

Still another important object of the present invention is to provide a lightning current waveform measuring system which utilizes a waveform generating device located at a remote site that transmits signals to a measuring or monitoring station by means of light waves so as to minimize electrical interference therewith.

These and other objects and advantages of the invention will become apparent upon reference to the following specification attendant claims and drawings.

DESCRIPTION OF A PREFERRED EMBODIMENT

Figure 1:
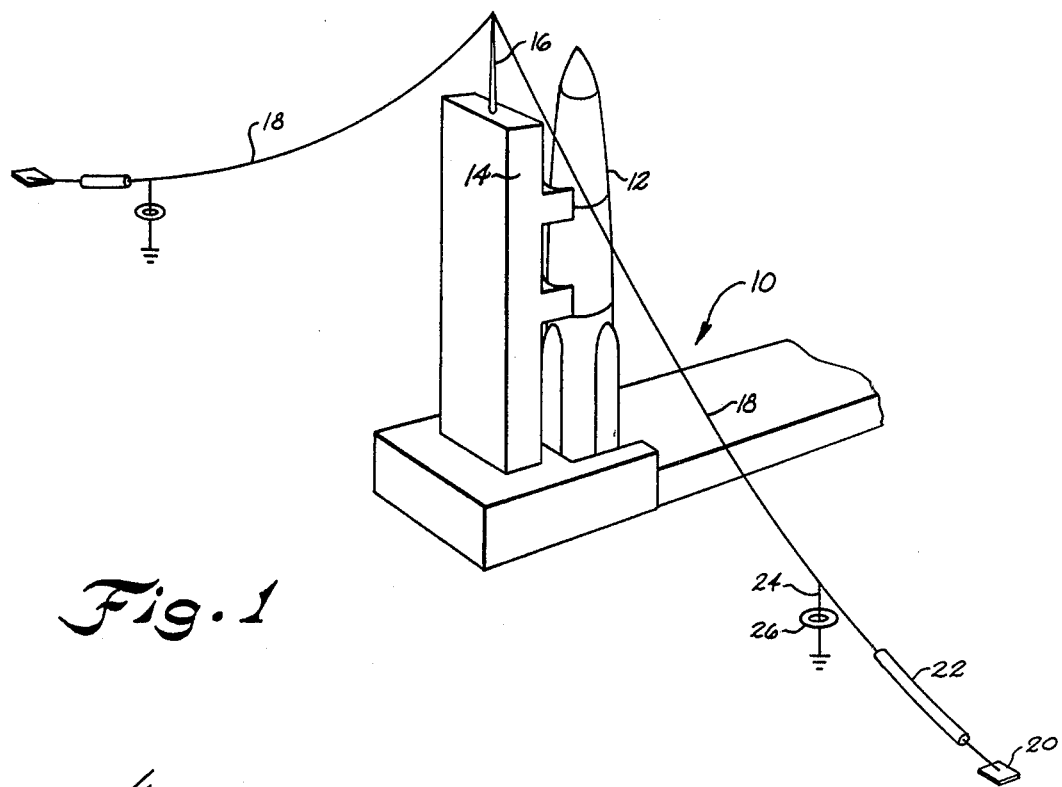
FIG. 1 is a perspective view illustrating a launch pad equipped with an elongated cable for monitoring lightning strikes.

Referring in more detail to FIG. 1 of the drawings, there is illustrated a launch platform generally designated by the reference character 10 having a space vehicle 12 mounted thereon adjacent a launch support platform 14. A tower 16 is carried on top of the launch support platform 14. Extending downwardly from the tower are elongated cables 18 which are anchored at 20 through an insulating member 22. An electrically conductive cable 24 extends downwardly from the cable 18 and is grounded.

This cable 18 acts as a lightning arrester in that when lightning strikes in the vicinity thereof a current is generated which flows through the cable 18 down through the mass 24 to ground rather than striking the space platform or space vehicle 12. The tower 16 may be an insulated pole which is mounted on top of the launching station.

Figure 2:
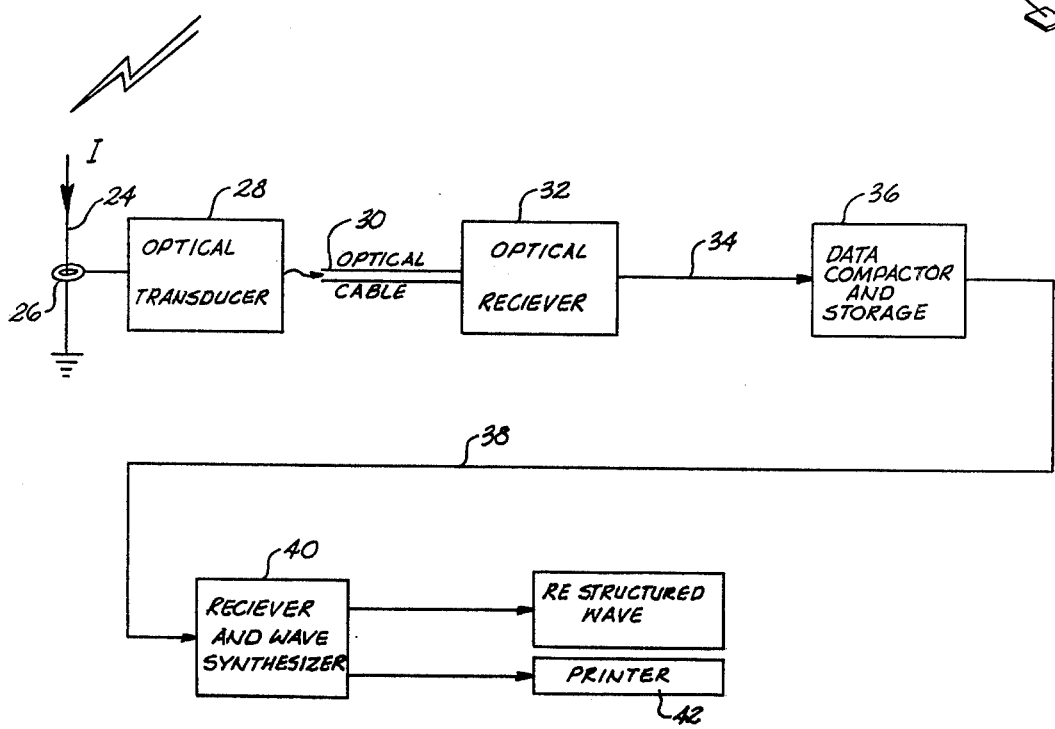
FIG. 2 is a block diagram illustrating an apparatus constructed in accordance with the present invention.

As illustrated in FIG. 2, the optical transducer includes a current transformer 26 which surrounds the mass 24 and generates a voltage proportional to the current flow through the mass. This voltage is subsequently analyzed and reconstructed to produce a waveform corresponding to the waveform of the electrical voltage produced by the lightning strike. The electrical voltage produced by the current transformer 26, which will be described in more detail in the discussion of FIG. 3 of the drawings, is, in turn, converted to a light signal by an optical transducer 28. This light signal is transmitted over an optical glass fiber cable 30 to an optical receiver 32 located remotely from the optical transducer 28. The optical cable 30 provides a substantially complete isolation of the sensitive equipment carried within the optical transducer. The optical receiver 22 receives the light signal and converts such back to an analog signal. The analog signal is supplied over line 34 to a data compactor and storage unit 36. The data compactor only stores changes in information received. Therefore, the only time that the data compactor and in the storage device 36 stores information is when there is a change of information.

Since the sampling is time-oriented, when there are rapid changes in the voltage produced by the lightning strikes such will produce frequent sampling points. However, if during the particular strike the voltage wave tends to level off and the change is not as great, then only information representing the time and change in the waveform needs to be stored. Accordingly, when reconstructing the waveform it is only necessary to draw a substantially straight line between these two time oriented samplings.

Information from the data compactor and storage unit is then transmitted over a telephone line 38 to a local station 40 which may be in the vicinity of 14 miles from the remote station. The rate that the data can be transmitted over the telephone line 38 is controlled by the quality of the telephone line. In other words, the data transmission rate should be selected so that such is compatible with the construction and capability of the telephone line 38.

The other end of the telephone line 38 is, in turn, connected to a receiver and wave synthesizer which controls the transmission of the information from the data compactor and storage device for reconstructing the wave, printing it, or feeding such to a printer 42.

Figure 3:
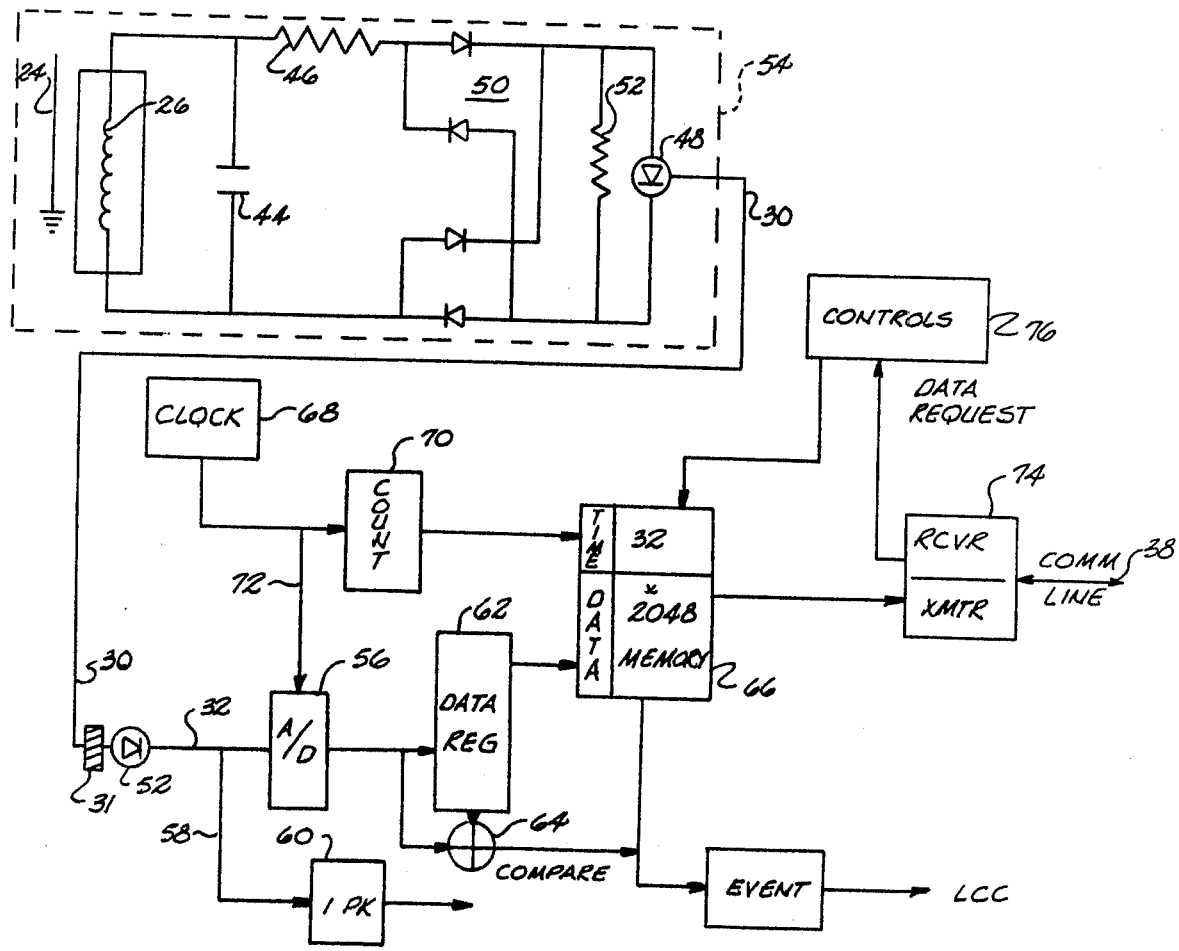
FIG. 3 is a more detailed schematic diagram illustrating the system constructed in accordance with the present invention.

Referring now to FIG. 3, there is illustrated a more detailed schematic of the circuitry illustrated in FIG. 2.

The current flowing through the mass 24 that was produced by the lightning strikes generates an induced voltage in an integrating coil 26 which corresponds in magnitude to the current flow through the mass 24. The coil 26 completely encircles the mass 24. This voltage, in turn, is filtered by a high frequency filter 44 which removes high frequency noise therefrom. The voltage then passes through a scaling resistor 46 which scales the current downwardly so that such can be accommodated by a light emitting diode 48. A full wave rectifier 50 switches the current through the light emitting diode 32 in the same direction regardless of the direction that the lightning is flowing.

A load resistor 51 is provided in the circuit between the full wave rectifier 50 and the light emitting diode 48 for providing a low impedance path for current flowing through the full wave rectifier 50 prior to exceeding the threshold value of the light emitting diode 48. The current passing through the light emitting diode 48 generates a light wave which is directly proportional to the electrical signal supplied thereto. This light wave is transmitted through a fiber optic cable 30.

The equipment enclosed in the broken lines 54 is carried within an electrically shielded housing. The fiber optic cable extends through a small hole provided in the wall of the shielded housing. The light wave being transmitted through the optic cable 30 is fed through an adjustable optical attenuator 31 to an optical receiver 52 which converts light back to an electrical voltage. The adjustable optical attenuator 31 sets the peak amplitude of the optical signal to within the linear response range of the optical receiver 52 and thus accommodates variations in the lengths of optical cable 30. It is to be understood that the receiver 52 may be spaced at a distance from the light emitting diode 48, and in one particular embodiment such is 1 kilometer. This provides electrical signal isolation to the sensitive equipment carried within the housing 54 containing the light emitting diode 48. Since the signal flowing through the optical cable 30 is transmitted in the form of a light wave, all of the circuitry illustrated on the right of FIG. 3 is completely electrically isolated from the equipment carried within the shielded box 54.

The electrical output of the optical receiver 52 via wire 32 is fed to an analog-to-digital converter 56 which converts the analog signal back to a digital signal. The analog signal is also coupled by means of lead 58 to a peak detector 60 which determines the peak value of the current produced by the lightning stroke. The output of the analog-to-digital converter 56 is in the form of a parallel signal and is fed to a data register 62, as well as to a comparator 64. The comparator 64 makes a comparison between the information previously stored in the data register 62 and the information being presently received. If this comparison is different, then the data register 62 loads the information stored therein into a memory 66 along with a count indicating the time sequence. The memory includes a storage portion for storing information representing the precise time of storing of the information, as well as a portion for storing the data from the data register 62.

The timing signal, which is stored within the memory, is generated by a clock 68 which operates a counter 70. Any suitable conventional clock and counter can be utilized in the circuit and one suitable conventional counter is manufactured by M. F. Electronics having a Ser. No. 5406-16M and one suitable conventional counter is manufactured by Texas Instruments bearing Ser. No. SN 74197. The clock signal produced by the clock 68 is also fed by means of leads 72 to the analog-to-digital converter 56 for synchronizing the loading of the data register 62 and the comparator 64. The clock 68 runs continuously, however, the information representing time of storage, is only transferred to the memory device 66 when the comparator 64 indicates a difference between the present word being received by the analog-to-digital converter 56 and a previously stored word in the data register 62. This eliminates redundant information and gaps between information. The counter 70 generates a signal which indicates the exact time that the information is stored in the memory since a count signal is stored simultaneously with the information being transferred from the data register 62 into the memory 66.

The output of the memory 66 is connected to a combined receiver and transmitter 74 which is provided for transmitting and receiving the information over a common line 38. The other end of the common line 38 is connected to a transmitter and receiver and wave synthesizer such as illustrated in block form in FIG. 2 and in more detail in FIG. 4 of the drawings.

A mode control circuit 76 is coupled to the receiver transmitter 74 and to the memory 66 for activating the memory upon request from an external source. Any suitable conventional transmitter may be utilized and one suitable transmitter is manufactured by Texas Instruments and has a Ser. No. SN 75154.

Figure 4:
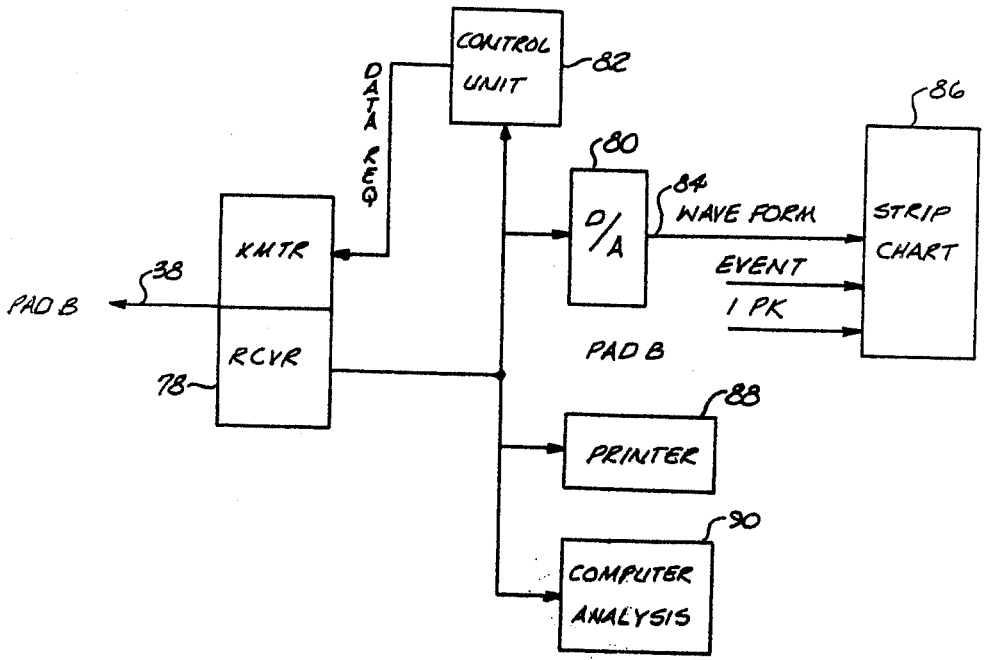
FIG. 4 is a block diagram illustrating the mechanism for reconstructing the waveforms produced by the lightning strikes.

Referring in more detail to FIG. 4 of the drawing the circuit illustrated therein is provided for reconstructing the waveform generated by the lightning strike from the information stored in memory 66. As previously mentioned, the information stored in memory 66 is compacted; however, as it was stored therein a timing signal indicating the exact time that the data was received was also stored therein. When this information is received by a receiver transmitter 78, responsive to a command being sent over cable 38 of the mode controller 76, it is fed to a digital-to-analog converter 80 for producing an analog signal corresponding to the digital signal received thereby. The time information received is fed to a control unit 82 which, in turn, delays the request from the next address location from the memory until a predetermined period of time has elapsed corresponding to the timing interval determined by the clock 68 and comparator 64 for reconstructing the waveform to its original shape. This reconstructed waveform is then fed out over lead 84 to be recorded on a strip chart 86. The information received by the receiver 78 can also be fed to other analyzing equipment such as a printer 88 and a computer analyzer 90. Any suitable conventional digital-to-analog converter, strip chart, printer, or control unit may be utilized for the digital-to-analog converter 80, the strip chart 86, the printer 88, and the control unit 82 shown in FIG. 4 of the drawing.

The control unit can be used for frequency (or time) scaling incoming signals either upwardly or downwardly. Normally, however such is used for scaling the signal downwardly so that it can be handled by conventional low frequency recording equipment and storage devices. It also permits recovery of data over low frequency lines such as line 38. The housing 54 in which the sensitive equipment such as the light emitting diode 48 is enclosed, is a double enclosure housing which gives a double shielding. The hole through which optical cable 30 extends is small in diameter (⅛ of an inch) and of such a small wave length so as to eliminate the radiation of electrical energy into the enclosure from outside the housing. The housing in one particular embodiment includes two copper boxes, one within the other with the walls thereof spaced ⅛ of an inch apart.

While a preferred embodiment of the invention has been described using specific terms, such description is for illustrative purposes only, and it is to be understood that changes and variations may be made without departing from the spirit or scope of the following claims.

What is claimed is:

1. An apparatus for monitoring current waveforms produced by lightning strikes comprising:
    (a) an elongated member positioned in the vicinity where it is desired to monitor the lightning strikes for having currents generated therein by said lightning strikes;
    (b) coil means encircling said elongated member generating a voltage responsive to current flowing through said elongated member;
    (c) a light emitting means connected to said coil means generating light waves corresponding to said voltage produced in said coil means;
    (d) an optical receiver remotely located from said area in which said lightning strikes are being monitored;
    (e) an optical cable connecting said light emitting means with said optical receiver for transmitting said light waves therebetween;
    (f) an analog-to-digital converter connected to said optical receiver for converting signals appearing on an output of said optical receiver into digital signals;
    (g) a memory for storing information;
    (h) a data register interposed between said memory and said analog-to-digital converter for storing the last information received from said analog-to-digital converter,
    (i) a comparator means for comparing the information previously stored in said data register with information coming from said analog-to-digital converter for loading the information stored in said data register into said memory when said comparison indicates a predetermined difference
    (j) a counter means producing a timing signal;
    (k) means for supplying said timing signal to said analog-to-digital converter for synchronizing the loading of said data register and said comparator; and
    (l) means for supplying said timing signal to said memory for recording the exact time said information is loaded into said memory from said data register.

2. The apparatus as set forth in claim 1 wherein said analog-to-digital converter produces said digital signals in parallel form on its output terminals.

3. The apparatus as set forth in claim 1 further comprising:
    (a) a transmitter/receiver connected to the output of said memory for transmitting said information to a remote location.

4. The apparatus as set forth in claim 3 further comprising:
    (a) a cable connected to said transmitter/receiver; and
    (b) a wave synthesizer connected to said cable for reconstructing said current waveforms from the information transmitted from said memory.

5. The apparatus as set forth in claim 1 further comprising:
    (a) a peak detector means connected to the output of said optical receiver for determining the peak value of the current produced in said elongated member by a lightning strike.

6. The apparatus as set forth in claim 1 further comprising: an optical attenuator located between said optical receiver and said optical cable for adjusting the maximum transmitted optical wave signal to within the linear range of said optical receiver and to compensate for variations in the length and transmissivity of said optical cable.

* * * * *